United States Patent [19]
Ross et al.

[11] Patent Number: 5,365,594
[45] Date of Patent: Nov. 15, 1994

[54] ACTIVE SOUND AND/OR VIBRATION CONTROL

[75] Inventors: Colin F. Ross, Stapleford; Graham P. Eatwell, Caldecote, both of United Kingdom

[73] Assignee: Active Noise and Vibration Technologies, Inc., Phoenix, Ariz.

[21] Appl. No.: 776,261

[22] PCT Filed: Apr. 20, 1990

[86] PCT No.: PCT/GB90/00617
§ 371 Date: Nov. 10, 1992
§ 102(e) Date: Nov. 10, 1992

[87] PCT Pub. No.: WO90/02447
PCT Pub. Date: Mar. 8, 1990

[30] Foreign Application Priority Data
Aug. 17, 1988 [GB] United Kingdom ............. 8819581.3

[51] Int. Cl.⁵ ............................................. G10K 11/16
[52] U.S. Cl. ............................................................. 381/71
[58] Field of Search ....................................... 381/71, 94

[56] References Cited
PUBLICATIONS

Nolet, "Solving or Resolving Inadequate and Noisy Tomographic Systems," J. Computational Physics, 1985, 61, No. 3, pp. 463–482.
Natterer, "Numerical Treatment of Ill-Posed Problems. Inverse Problems." Springer, Berlin-N.Y.; 142–167. Seines: Lecture Notes in Math, 1225, 1986.
Hansen, "The Truncated SVD as a Method for Regularization." Bit, Computer Science Numerical Mathematics, 1987, 27, No. 4, pp. 534–553.

*Primary Examiner*—Forester W. Isen
*Attorney, Agent, or Firm*—Lee, Mann, Smith, McWilliams, Sweeney & Ohlson

[57] ABSTRACT

A signal processing system, especially for use in vibration control, wherein noise-free signals inductive of the timing of a primary source and of the timing of at least one interfering secondary source of periodic vibrations are provided as inputs, together with a vibration input signal derived from a sensor sampling the vibrations, and wherein the signals are processed to produce an output representative of interference free vibration of the primary source.

4 Claims, 4 Drawing Sheets

$$r_i(n) = y_i(n) + \sum_m \sum_{j=1}^{J} I_{ij}(nT-mT)x_j(m) \qquad (3.1)$$

$$x_j(m) = x_j(m + N) \qquad (3.2)$$

$$r_i(n) = y_i(n) + \sum_{m=0}^{N-1} \sum_{j=1}^{J} a_{ij}(nT-mT)x_j(m) \qquad (3.3)$$

$$a_{ij}(nT-mT) = \sum_k I_{ij}(nT-mT-kNT) \qquad (3.4)$$

$$A_{ij}(kf) = \frac{1}{N} \sum_{n=0}^{N-1} a_{ij}(nT)e^{2\pi i kn/N} \qquad (3.5)$$

$$R_i(k) = Y_i(k) + \sum_{j=1}^{J} A_{ij}(kf) X_j(k),$$
$$k = 0, 1, \ldots, N-1 \qquad (3.6)$$

$$A_{ij}(kf) = \sum_{m=1}^{J} U_{im}(kf)D_m(kf) V^*_{mj}(kf) \qquad (3.7)$$

FIG.1.

$$\sum_{i=1}^{M} U^*_{\ell i} U_{im} = \delta_{\ell m} \qquad (3.8)$$

$$\sum_{j=1}^{J} V^*_{mj} V_{j\ell} = \delta_{\ell m} \qquad (3.9)$$

$$\tilde{R}_\ell(kf) = \tilde{Y}_\ell(kf) + D_\ell(kf) \tilde{X}_\ell(kf) \qquad (3.10)$$

$$\tilde{R}_\ell(kf) = \sum_{i=1}^{m} \overset{*}{U}_{\ell i}(kf) R_i(k) \qquad (3.10.1)$$

$$\tilde{Y}_\ell(kf) = \sum_{i=1}^{m} U^*_{\ell i}(kf) Y_i(k) \qquad (3.10.2)$$

$$\tilde{X}_\ell(kf) = \sum_{j=1}^{J} V^*_{\ell j}(kf) X_j(k) \qquad (3.10.3)$$

$$\tilde{R} = \tilde{Y} + D\tilde{X} \qquad (3.11)$$

$$\tilde{X}^n = \tilde{X}^{n-1} - \mu \tilde{R}^{n-1} \qquad (3.12)$$

FIG. 2.

$$\tilde{R}^n = \tilde{Y}^n + D(\tilde{X}^{n-1} - \mu \tilde{R}^{n-1}) \quad (3.12.1)$$

$$\tilde{X}^{n-1} = (\tilde{R}^{n-1} - \tilde{Y}^{n-1})/D \quad (3.12.2)$$

$$\tilde{R}^n = \tilde{Y}^n - \tilde{Y}^{n-1} + (1-\mu D)\tilde{R}^{n-1} \quad (3.13)$$

$$0 < \mu D < 2, \quad (3.14)$$

$$\mu = \mu_\ell(kf), \quad (3.15)$$

$$X_j(k) = \sum_\ell V_{j\ell}(kf)\tilde{X}_\ell(kf) \quad (3.16)$$

$$\tilde{X}^n = \tilde{X}^{n-1}(1-\mu\lambda) - \mu \cdot \hat{R}^{n-1} \quad (3.17)$$

FIG. 3.

ACTIVE SOUND AND/OR VIBRATION CONTROL

FIELD OF INVENTION

This invention relates generally to systems for controlling sound or vibration, and more especially to active control systems which use a plurality of actuators to produce a controlling sound or vibration field and a plurality of sensors to measure the residual field.

In contrast to previous systems aimed at controlling periodic sound or vibration, the system of the invention can be used even when the fundamental period of vibration is changing rapidly. For example, it can be used to control the engine noise in the interior of a vehicle.

The improved method in accordance with the invention uses orthogonal transformations to, reduce a multichannel control system to a series of single channel systems and provides a method by which the output of each such system can be adapted to maintain good performance of the control system even when the fundamental frequency of the vibration or sound source is changing.

BACKGROUND OF THE INVENTION

The principles of active sound and vibration control have been known for many years and there is a wealth of published literature. Most patent specifications in this field relate to methods applicable to particular situations. The method and system described herein relate to the control of periodic or almost periodic sound and vibration. The two main approaches to this problem are:

(i) Wave shaping or filtering, eg U.S. Pat. No. 4,506,380 and published UK Patent Application No. 2,201,858, where a reference signal containing one or more frequencies of the unwanted sound and vibration is filtered to produce the signals to send to actuators which in turn produce the desired sound or vibration.

(ii) Waveform synthesis, where a waveform-generator istriggered by a signal derived from the source, eg UK Patent Specification No. 1,577,322.

The two methods are equivalent only if the vibration source is exactly periodic. If the source characteristics are changing in time it is usual to use an adaptive control system in which sensors in the region to be controlled sense the residual sound or vibration and pass the information to a processor which alters the filter coefficients or the synthesized waveform so as to provide better control. Published UK Patent Application No. 2,201,858 describes methods for adapting filter coefficients. UK Patent Specification No. 1,577,322 recognises the need for adaption and a later patent specification, UK Patent No. 2,107,960, describes a simple technique for such a system using a single actuator and sensor. This latter patent specification does not explain how to control vibration where the period is changing, except to suggest that in this case the transform technique should produce frequency components from the lowest expected frequency to the highest, rather than just at frequencies corresponding to the harmonics of the source.

A further Patent Specification No. 2,122,052, uses a waveform synthesis technique for vibration control. In this method a sensor and actuator are placed at each of a number of locations. This results in a system with equal numbers of sensors and actuators and a method for adapting the waveform is presented for this special case. In most applications, however, the sources and sensors are not colocated and usually more sensors than sources are used in an effort to obtain a better measure of the resulting sound or vibration.

BRIEF DESCRIPTION OF THE DRAWINGS

FIGS. 1-3 depict equations described in the specification.

THE INVENTION

Figure 4:
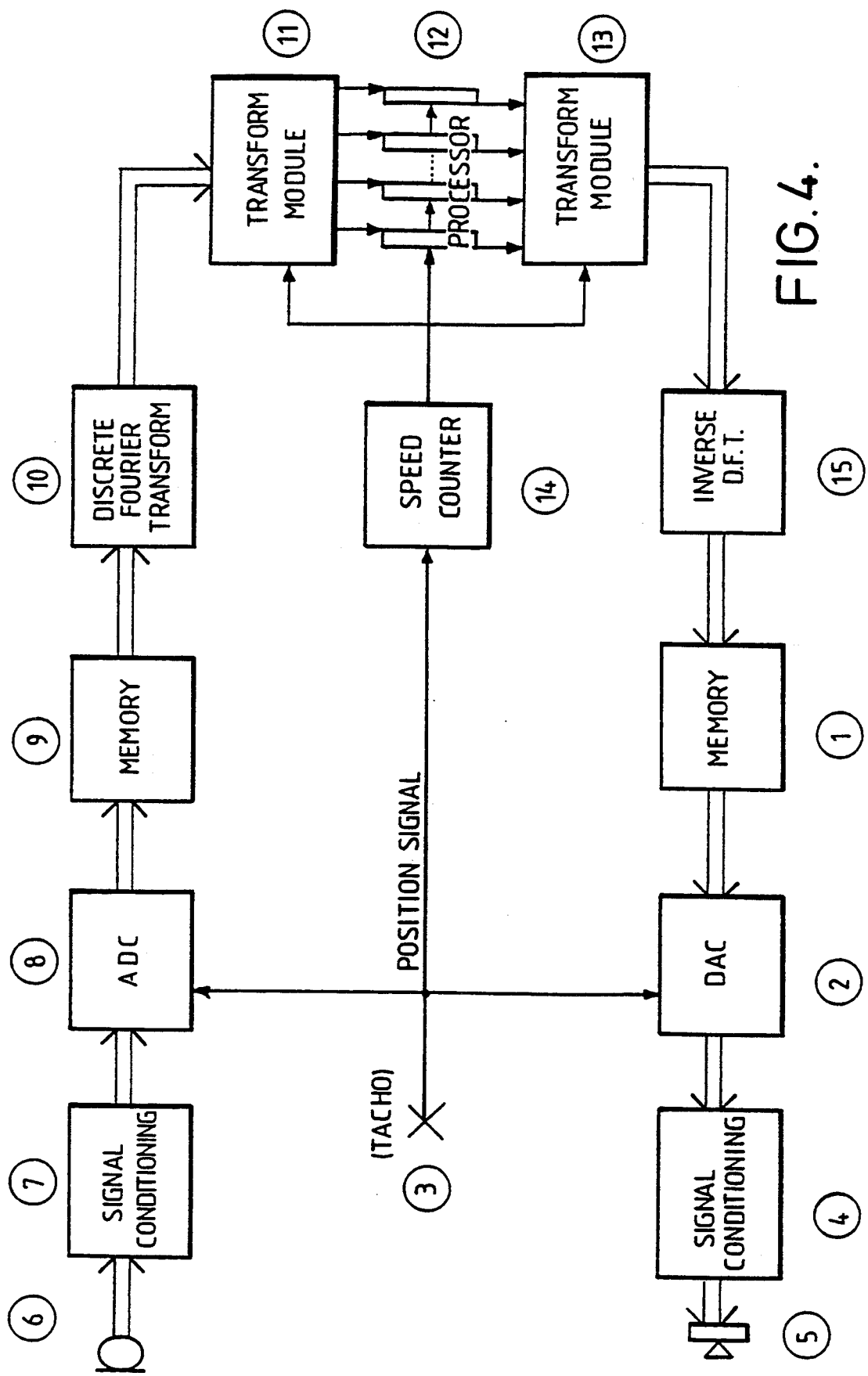
FIG. 4 depicts an embodiment of the invention.

The theoretical background to the present invention will now be described. The numbered mathematical equations referred to are set out in accompanying drawings.

The signal from each of a plurality of sensors is sampled using an analogue to digital converter (ADC) triggered by a signal related to the position of the source in its cycle. The data may be averaged over several cycles to improve accuracy. This gives an almost periodic sequence to which an orthogonal transform, such as the discrete Fourier transform, can be applied. This process is well known for the analysis of periodic signals, and is referred to as "order ratio analysis" or "order locked analysis".

The sample signal from the i-th sensor is given by equation (3.1), where $I_{ij}(nT)$ is the response at sensor i, due to an impulse at the j-th controller output, $x_j(m)$ is the m-th value of the j-th controller output, $y_i(n)$ is the n-th value of sensor signal in the absence of any control and T is the sampling interval. J is the number of controller outputs. A slightly more complicated expression must be used if the length of the impulse response is comparable with the time over which the sampling period changes significantly. If $r_i$ is sampled N times per cycle, then since $x_j$ is periodic, equation (3.2) is applicable, where NT is the fundamental period. Equation (3.1) can then be written as equation (3.3), where equation (3.4) defines the cyclic impulse response.

An orthogonal transform can be used to simplify equation (3.3).

An example of this is a discrete Fourier transform defined by equation (3.5), where $f=1/NT$ is the fundamental frequency.

Equation (3.3) then becomes equation (3.6).

It is to be noted that, since $R_i$, $Y_i$ and $X_j$ are sampled an exact number of times per cycle, they do not depend on the frequency, f. Equation (3.6) shows that each harmonic, k, of the system can be considered separately.

The control problem is to find the components $X_j(k)$ which produce the desired values of $R_i(k)$. This problem is complicated because all of the control outputs, $X_j(k)$ interact to produce each sensor signal. It is possible, however, to use a technique which transforms the set of coupled equations (3.6) into a set of independent equations. The technique employs a singular value decomposition of the transfer function matrix $A_{ij}(kf)$ for each kf. This gives equation (3.7), where the asterisk denotes complex conjugation. The matrices with complex components $U_{im}$ and $V_{mj}$ represent orthogonal transformations and so have the properties given by equations (3.8) and (3.9), where M is the number of sensors and $\delta_{lm}$ is the Kronecker delta. The term $D_m(kf)$ is the m-th singular value at frequency kf. It is a real quantity. The method of decomposition is described in "Numerical recipes—the art of scientific computing" by W H Press and others, Cambridge University Press, 1986, pages 52 to 64. Equation (3.6) can be multiplied by $U^*_{li}$ and summed over i to give equation (3.10), to which equations (3.10.1) and (3.10.2) and (3.10.3) are applicable.

These quantities are called the principal components of the corresponding signals. Equation (3.10) is a single equation for the component $\bar{X}_l(kf)$ of the desired controller output, which can be solved directly if $\bar{Y}$ and $\bar{R}_l$ are known or, since $\bar{Y}$ may be changing, can be solved iteratively using standard adaption algorithms. If the explicit dependence on l and kf is dropped, equation (3.10) reduces to equation (3.11).

If the aim is to make $\bar{R}$ as small as possible, one algorithm, at the n-th step, results in equation (3.12), where $\mu$ is a real convergence factor.

Using equation (3.11) and (3.12) gives equation (3.12.1), and from equation (3.11), equation (3.12.2) results.

These can be combined to give equation (3.13) and this shows that the algorithm is stable provided equation (3.14) is applicable, whereby optimal convergence is obtained when $\mu D = 1$.

Hence it is desirable that equation (3.15) applies, that is, a different convergence factor is used for each frequency and each principal component.

In order to implement this algorithm it is necessary to measure the transfer functions $A_{ik}(kf)$ at a number of different frequencies, kf. This can be done during an initial start-up or calibration phase and if necessary can be adapted using a parameter estimator as described in UK Patent Application 8825074.1. The transformation matrices U9kf) and V(kf) and the singular values $D_{dl}(kf)$ are calculated from the measured transfer functions. and stored for each frequency. During operation the frequency f (or, equivalently, the period T) is measured so that the appropriate transformation matrices and singular values can be used. Since kf is unlikely to correspond exactly to a value for which the transfer function was measured, the nearest value is used. Alternatively interpolation between nearby values could be used to obtain more accuracy. In order to maintain a given accuracy the former method uses more memory and the latter uses more computation time.

Once $\bar{X}$ (kf) has been found, equations (3.9) and (3.10.3) can be used to give equation (3.16).

It is then possible to apply an inverse discrete Fourier transform to obtain $x_j(n)$. These control signals are sent to digital to analogue converters (DACs), then filtered and amplified to provide the drive signals for the actuators.

In some applications it is desirable that the actuators are not driven too hard, and it is important that the signals to the DAC's are within the correct range. One particular method of limiting the drive amplitudes is to use a minimisation constraint, $\lambda$ in the algorithm given by equation (3.17). The constraint $\lambda$ can be adapted after each iteration, that is $\lambda$ is increased if any of the drive signals $x_j$ is too large or reduced if they are all in the desired range.

DESCRIPTION OF EMBODIMENT

The invention is exemplified with reference to the accompanying drawings, in which the single figure following the invention shows one embodiment of apparatus for implementing the method.

Digital values are stored in a memory device (1), which may for example be a FIFO device. These values are sent to a set of digital to analogue converters (DACs) (2) which are triggered N times per cycle by a train of electrical pulses from a sensor (3). These pulses relate to the position of the source in its cycle. The analogue signals from the DACs are passed through signal conditioners (4) to provide the drive signals for a number of actuators (5). The resulting sound or vibration field is measured by sensors (6). The signals from these sensors are used to adapt the values stored in the memory device (1) so that the sensor signals approach the desired values. The sensor signals are passed through signal conditioners (7) and then sampled in synchrony with the source using analogue to digital converters (8) which are triggered by signals from the position sensor (3). These sampled values are placed in memory device (9) and may be averaged over a number of complete cycles to reduce the effects of signals unrelated to the source. A transform module (10), which may use a discrete Fourier transform, produces components related to the harmonic frequencies of the source for each sensor. The components from the different sensors are then combined in the transform module (11) so as to produce the principal components of sensor signals. Each of these independent components is modified in the adaption module (12) to produce the principal components of the new drive signals. These are combined with transform module (13) to produce the frequency components of each drive signal which are then converted to time values via an inverse transform module (15). The new time values then replace those in the memory device (1). The transform modules (11) and (13) and the adaption modules (12) require knowledge of the period or frequency of the source. This may be obtained from the position signal via a frequency counter (14) which contains a real time clock. This method can be used in aircraft cabins where the source of the noise is the propellers or propfans.

An important application of the method of active control described above is in the control of engine related noise in vehicles. A control system for controlling the "boom" in automobile interiors is described in published UK Patent Application 2,201,858. It uses the wave shaping or filtering technique described above. The system is designed to adapt on a time scale comparable with delays associated with the propagation time of sound from the actuators to the sensors. In an automobile interior, however there is sound from many sources which are not related to the engine: for example, road noise, wind noise, sound from the in-car entertainment system. This noise contaminates the sensor signals and degrades the performance of the system.

The method of this invention uses averaging of the synchronously sampled signals over several cycles. This reduces the level of contamination and improves the performance of the system. However, the time taken for averaging reduces the ability of the system to track changes in the sound field due to changes in engine speed and load. Therefore, for a given level of contaminating noise, there will be an optimum number of cycles for averaging which will depend upon the rate of change of engine speed and load. The rate of change of engine speed may be obtained from the position signal and engine load may be obtained from additional sensors, such as a pressure sensor in the inlet manifold or throttle position sensor. This information can be used to control the rate of adaption so that optimal performance of the system can be obtained. This enables good performance to be obtained over a whole range of conditions rather than just at "boom" where the unwanted sound is much louder than the contaminating noise.

Most modern automobile engines use computer controlled engine management systems. Some of the sensors could be used both for the active control system and the engine management system. Additionally, the same microprocessor could be used to control both systems.

We claim:

1. An active sound or vibration cancelling apparatus for cancelling sound or vibration from a source thereof, comprising:
   a. a source of sensing means, having an output, for producing a source signal related to the phase of unwanted sound or vibration at the source;
   b. a distributed plurality of sound or vibration sensors, each having an output;
   c. a distributed plurality of sound or vibration producing actuators;
   d. analogue-to-digital converter means for sampling output signals of said sound or vibration sensors in dependence on the source signal, said converted means having an output; and
   e. processing means responsive to the output of said analogue-to-digital converter means to produce drive signals for said sound or vibration producing actuators to effect cancellation of noise or vibration from said source thereof;
   f. wherein said processing means uses data in the form of singular values representing a singular value decomposition of a matrix representing transfer functions between said plurality of actuators and said plurality of sensors to calculate said drive signals.

2. An apparatus according to claim 1, wherein said processing means produces said drive signals with reference to a look up table containing data representing the relevant transfer functions between said actuators and said sensors for a plurality of discrete source frequencies.

3. An apparatus according to claim 2, wherein said processing means interpolates between the look up table data when said table does not contain data for a given current source fundamental frequency.

4. An apparatus according to claim 2, wherein said data comprises transfer function data at harmonics of discrete source fundamental frequencies.

* * * * *

UNITED STATES PATENT AND TRADEMARK OFFICE
CERTIFICATE OF CORRECTION

PATENT NO.  : 5,365,594
DATED       : November 15, 1994
INVENTOR(S) : Eatwell et al It is certified that error appears in the above-indentified patent and that said Letters Patent is hereby corrected as shown below:

On the title page: Item [19] and Item [75]

Inventors should read --Graham P. EATWELL, Caldecote; Christopher M. DORLING, Cambridge; William R. HODSON, Cambridge, all of United Kingdom--. "Colin F. ROSS" should be deleted.

Abstract:
The Abstract should be deleted in its entirety and the following inserted:

--An active sound or vibration control system for compensating noise or vibration arising from a periodic source of changing periodicity, wherein sensors sense the existing noise and vibration, the sensor signals are sampled several times per cycle by an ADC triggered by a signal output from a sensor detecting the position of the source in its cycle, the sampled signals are transformed into compensation actuator drive signal values by a series of transform and adaption modules based on algorithms dependent on the frequency of the source, and the drive signal values are stored in a memory means continually updated by the values derived from the sampled sensor signals.--

Signed and Sealed this

Ninth Day of January, 1996

*Attest:*

BRUCE LEHMAN

*Attesting Officer*     *Commissioner of Patents and Trademarks*